(12) United States Patent
Cho et al.

(10) Patent No.: US 10,644,003 B2
(45) Date of Patent: May 5, 2020

(54) SEMICONDUCTOR MEMORY DEVICES HAVING BIT LINE NODE CONTACT BETWEEN BIT LINE AND ACTIVE REGION

(71) Applicant: SAMSUNG ELECTRONICS CO., LTD., Suwon-si, Gyeonggi-do (KR)

(72) Inventors: Min Hee Cho, Suwon-si (KR); Satoru Yamada, Yongin-si (KR); Junsoo Kim, Seongnam-si (KR); Honglae Park, Seongnam-si (KR); Wonsok Lee, Suwon-si (KR); Namho Jeon, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 125 days.

(21) Appl. No.: 15/661,121

(22) Filed: Jul. 27, 2017

(65) Prior Publication Data

US 2018/0158826 A1  Jun. 7, 2018

(30) Foreign Application Priority Data

Dec. 2, 2016 (KR) .................. 10-2016-0163764

(51) Int. Cl.
  *H01L 27/108* (2006.01)
  *H01L 29/20* (2006.01)
  *H01L 29/161* (2006.01)

(52) U.S. Cl.
  CPC .. *H01L 27/10805* (2013.01); *H01L 27/10823* (2013.01); *H01L 27/10876* (2013.01); *H01L 29/161* (2013.01); *H01L 29/20* (2013.01)

(58) Field of Classification Search
  CPC ......... H01L 27/10888; H01L 27/10885; H01L 27/10891; H01L 29/4236
  See application file for complete search history.

(56) References Cited

U.S. PATENT DOCUMENTS

| | | | |
|---|---|---|---|
| 6,528,835 B1 | 3/2003 | Kaeriyama | |
| 7,326,975 B2 | 2/2008 | Kim et al. | |
| 7,659,571 B2 | 2/2010 | Yamazaki | |
| 7,728,373 B2 | 6/2010 | Seo et al. | |
| 7,867,851 B2 | 1/2011 | Hanson et al. | |
| 7,944,743 B2 | 5/2011 | Tang et al. | |
| 8,012,828 B2 | 9/2011 | Min et al. | |
| 8,163,646 B2 * | 4/2012 | Kang | H01L 21/76897 257/532 |
| 8,222,105 B2 | 7/2012 | Haller et al. | |
| 8,519,462 B2 | 8/2013 | Wang et al. | |
| 8,796,762 B2 | 8/2014 | Lindsay et al. | |
| 9,177,851 B2 * | 11/2015 | Min | H01L 21/76224 |
| 9,431,324 B2 * | 8/2016 | Shin | H01L 23/481 |

(Continued)

OTHER PUBLICATIONS

Takaaki Tsunomura et al., "Analysis of NMOS and PMOS Difference in VT Variation With Large-Scale DMA-TEG" IEEE Transactions on Electron Devices, vol. 56, No. 9, Sep. 2009, pp. 2073-2080.

*Primary Examiner* — Khiem D Nguyen
(74) *Attorney, Agent, or Firm* — Lee IP Law, P.C.

(57) ABSTRACT

A semiconductor memory device includes a substrate having an active region, word lines extending across the active region, a bit line on the active region between the word lines, a bit line node contact between the bit line and the active region, and a storage node contact on an end portion of the active region, wherein one or more of the bit line node contact or the storage node contact include silicon germanium.

6 Claims, 16 Drawing Sheets

(56) References Cited

U.S. PATENT DOCUMENTS

| | | | |
|---|---|---|---|
| 2003/0124822 A1* | 7/2003 | Suh | H01L 21/26586 |
| | | | 438/514 |
| 2009/0014789 A1* | 1/2009 | Manabe | H01L 21/82384 |
| | | | 257/334 |
| 2013/0049090 A1* | 2/2013 | Lindsay | H01L 21/26586 |
| | | | 257/306 |
| 2013/0241027 A1* | 9/2013 | Kwak | H01L 29/0649 |
| | | | 257/506 |
| 2014/0054775 A1* | 2/2014 | Kim | H01L 23/53266 |
| | | | 257/751 |
| 2014/0231892 A1* | 8/2014 | Song | H01L 21/76897 |
| | | | 257/296 |
| 2015/0194438 A1* | 7/2015 | Kim | H01L 27/10876 |
| | | | 257/324 |
| 2015/0221742 A1* | 8/2015 | Yi | H01L 29/4236 |
| | | | 257/295 |
| 2015/0294975 A1* | 10/2015 | Nakata | H01L 27/10891 |
| | | | 257/334 |
| 2016/0064386 A1* | 3/2016 | Park | H01L 21/31116 |
| | | | 438/381 |
| 2016/0087035 A1* | 3/2016 | Kim | H01L 29/0653 |
| | | | 257/368 |
| 2016/0233220 A1* | 8/2016 | Danek | H01L 27/10891 |

* cited by examiner

US 10,644,003 B2

SEMICONDUCTOR MEMORY DEVICES HAVING BIT LINE NODE CONTACT BETWEEN BIT LINE AND ACTIVE REGION

CROSS-REFERENCE TO RELATED APPLICATIONS

Korean Patent Application No. 10-2016-0163764, filed on Dec. 2, 2016, and entitled, "Semiconductor Memory Devices," is incorporated by reference herein in its entirety.

BACKGROUND

1. Field

One or more embodiments herein relate to semiconductor memory devices.

2. Description of the Related Art

Efforts are being made to make semiconductor devices smaller, with greater functionality and integration, and at lower cost. Increasing integration reduces the line widths of patterns in a semiconductor device. This may adversely affect performance.

SUMMARY

In accordance with one or more embodiments, a semiconductor memory device includes a substrate including an active region; word lines extending across the active region in a first direction; a bit line on the active region between the word lines, the bit line extending in a second direction crossing the first direction; a bit line node contact between the bit line and the active region; and a storage node contact on an end portion of the active region, wherein one or more of the bit line node contact or the storage node contact include silicon germanium.

In accordance with one or more other embodiments, a semiconductor memory device includes a substrate including an active region; word lines extending across the active region in a first direction and in the substrate; a first semiconductor pattern surrounding sidewalls and a bottom surface of each of the word lines; and a bit line on the active region between the word lines, the bit line extending in a second direction crossing the first direction, wherein the substrate and the first semiconductor pattern include different semiconductor materials.

In accordance with one or more other embodiments, a memory cell includes a capacitor; and a PMOS transistor coupled to the capacitor, wherein the PMOS transistor includes a source/drain region having a trivalent impurity material and an active area compressively stressed by a material adjacent to the active area.

BRIEF DESCRIPTION OF THE DRAWINGS

Features will become apparent to those of skill in the art by describing in detail exemplary embodiments with reference to the attached drawings in which:

FIGS. 5A to 10A illustrate various stages in an embodiment of a method for fabricating a semiconductor memory device; and FIGS. 5B to 10B illustrate views along section line I-I' in FIGS. 5A to 10A.

DETAILED DESCRIPTION

Figure 1:
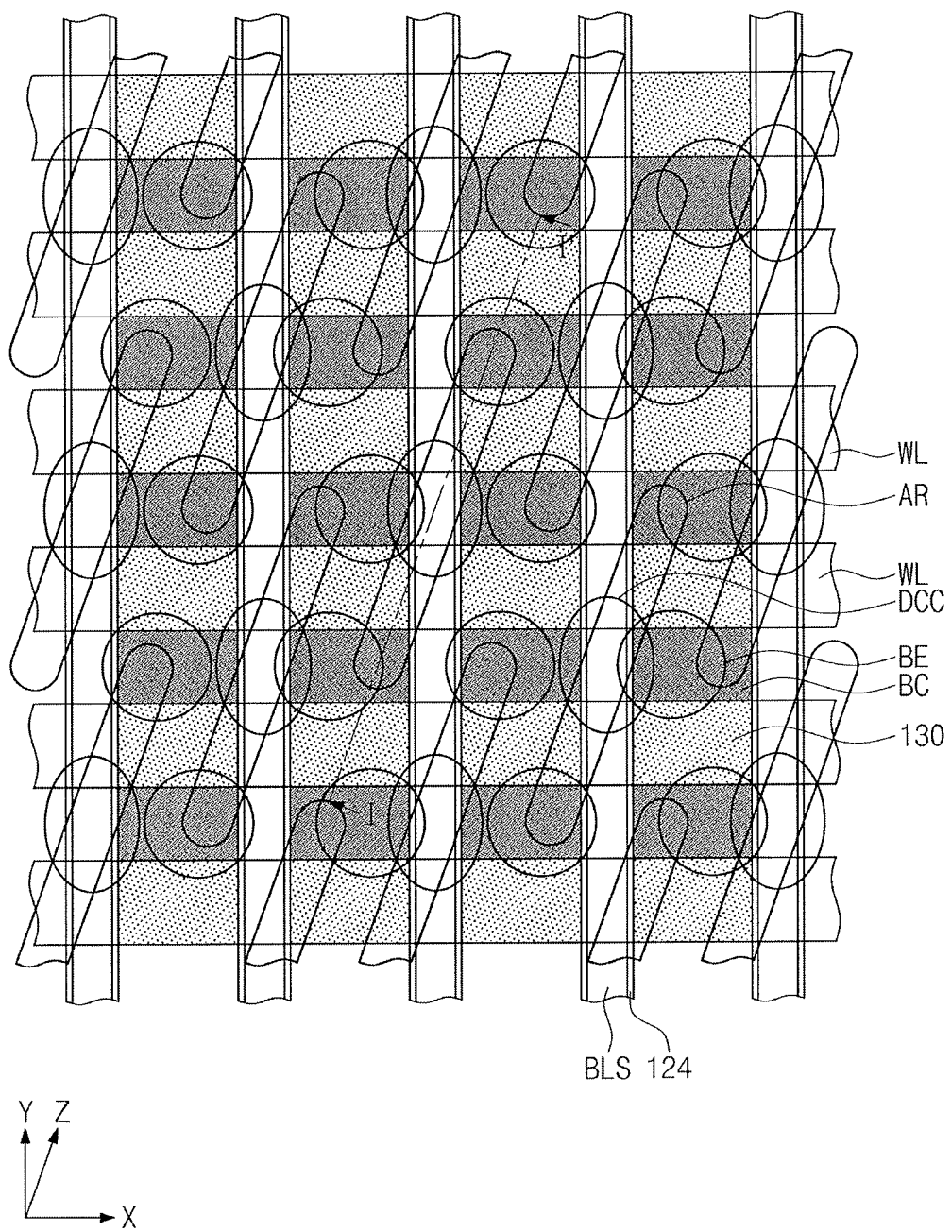
FIG. 1 illustrates an embodiment of a semiconductor memory device.
Figure 2:
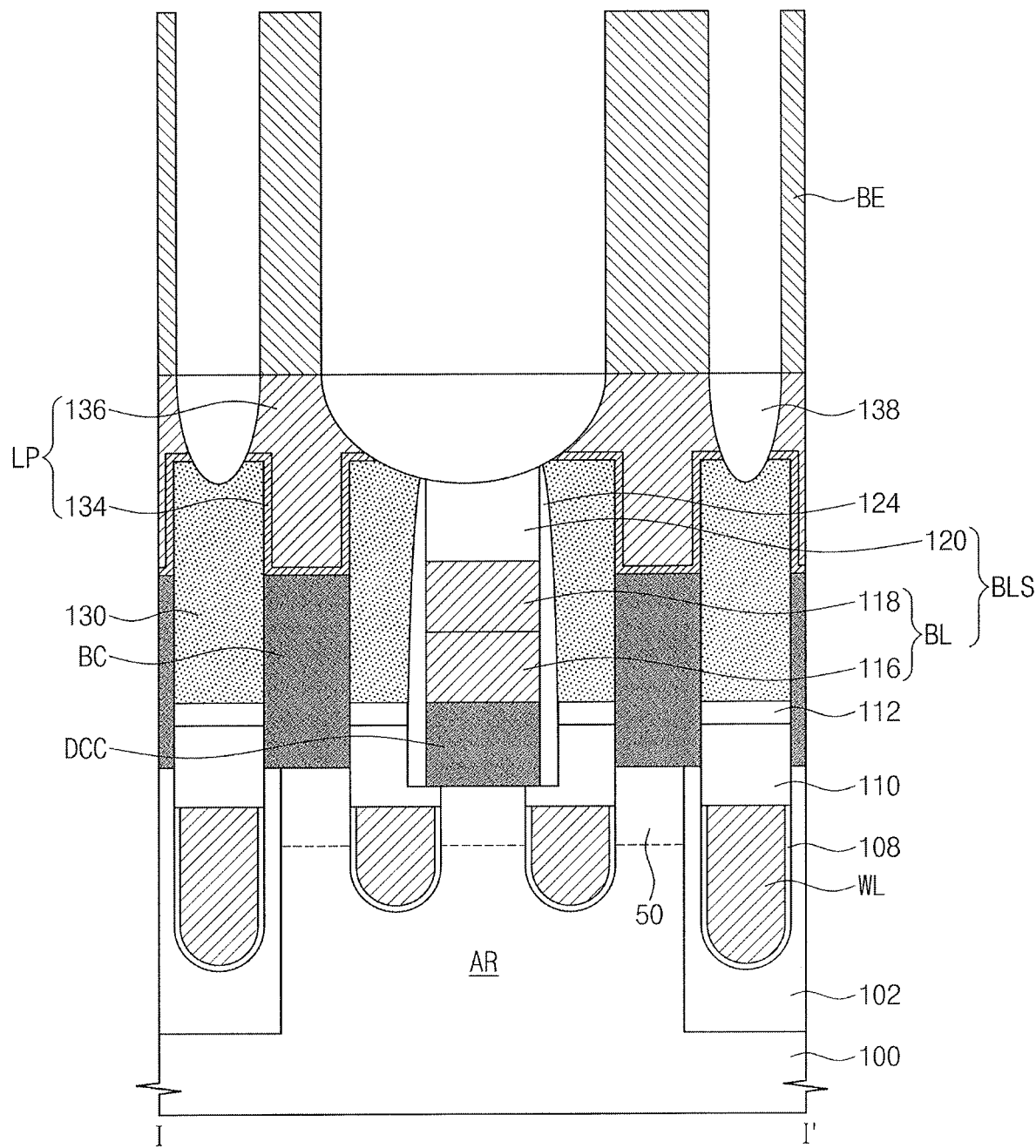
FIG. 2 illustrates a sectional embodiment along line I-I' in FIG. 1.

FIG. 1 illustrates an embodiment of a semiconductor memory device. FIG. 2 illustrates a cross-sectional view taken along line I-I' in FIG. 1. Referring to FIGS. 1 and 2, a device isolation layer 102 may be in a substrate 100, which, for example, may be a bulk silicon substrate, a silicon-on-insulator (SOI) substrate, a germanium substrate, a germanium on insulator (GOI) substrate, a silicon-germanium substrate, a III-V group compound semiconductor substrate, or an epitaxial thin-film substrate obtained by performing selective epitaxial growth (SEG).

The device isolation layer 102 may include an insulating material (e.g., silicon oxide) and may define active regions AR of the substrate 100. The active regions AR may have a predetermined (e.g., bar) shape elongated in a third (e.g., Z) direction. The active regions AR may be parallel to each other in the third direction.

Source/drain regions 50 may be in each of the active regions AR and may have conductivity different from the substrate 100. For example, the source/drain regions 50 may have P-type conductivity to form a PMOS transistor. In one embodiment, the source/drain regions 50 may include a trivalent impurity element. The source/drain regions 50 may include, for example, boron (B) or indium (In).

When the substrate 100 is a silicon-based substrate, the substrate 100 may include, for example, dangling bonded silicon atoms that are not bonded to oxygen ions. Operating characteristics of transistors may be stabilized by a hydrogen annealing process, by which hydrogen atoms are bonded to the dangling bonded silicon atoms of the substrate 100. In this case, hydrogen atoms may be easily separated from silicon atoms, but boron may increase a binding energy between silicon atoms and hydrogen atoms. It thus may be possible to improve variable retention time or charge holding time of a memory cell (e.g., a capacitor CP) in a semiconductor memory device.

Because indium has an atomic weight greater than those of other trivalent impurity elements, indium may be uniformly dispersed in the source/drain regions 50 in one embodiment. An improved distribution of threshold voltage may therefore be achieved and electron leakage between word lines WL and capacitors CP may be reduced or prevented.

Word lines WL may be in the substrate 100. For example, two word lines WL may run across one active region AR in a first (e.g., X) direction crossing the third direction. The word lines WL may have top surfaces lower than that of the substrate 100, and may include conductive material, e.g., doped polysilicon, metal, or metal silicide.

Gate dielectric layers 108 may be between the substrate 100 and sidewalls of respective word lines WL and between the substrate 100 and a bottom surface of respective word lines WL. Each gate dielectric layer 108 may include, for example, a silicon oxide layer, a thermal oxide layer, or a high-k dielectric layer. A capping pattern 110 may be on the top surface of each of the word lines WL and a top surface of the gate dielectric layer 108. The capping pattern 110 may have a top surface at the same level as that of the substrate 100 and may include an insulating material (e.g., a silicon oxide layer).

A buffer layer 112 may be on the top surface of the substrate 100 and may cover the top surface of the capping pattern 110. The buffer layer 112 may include one or more insulation layers. For example, the buffer layer 112 may include a silicon oxide layer, a silicon nitride layer, a silicon oxynitride layer, or a plurality of insulation layers including at least two thereof.

A bit line node contact DCC may be on a central portion of one active region AR between two word lines WL running thereacross. The buffer layer 112 may be penetrated with the bit line node contact DCC electrically connected to one source/drain region 50 in the active region AR between two word lines WL. The bit line node contact DCC may have a bottom surface at a level between the top surface of the substrate 100 and the top surfaces of the word lines WL. The bit line node contact DCC may include a compressively strained material. For example, the bit line node contact DCC may include silicon germanium or boron-doped silicon germanium.

Bit line structures BLS may extend in a second (e.g., Y) direction crossing the first and third directions. Each of the bit line structures BLS may run over a plurality of the bit line node contacts DCC arranged in the second direction. A single bit line structure BLS may be electrically connected to a plurality of the bit line node contacts DCC arranged in the second direction.

Each of the bit line structures BLS may include a bit line BL and an insulation pattern 120 sequentially stacked on the bit line node contact DCC. The bit line BL may include a first conductive pattern 116 and a second conductive pattern 118. The first conductive pattern 116 may include, for example, doped polysilicon. The second conductive pattern 118 may include, for example, one of tungsten (W), aluminum (Al), copper (Co), nickel (Ni), and cobalt (Co). The insulation pattern 120 may be on the second conductive pattern 118. The insulation pattern 120 may include, for example, a silicon oxide layer. A diffusion barrier layer may be between the first conductive pattern 116 and the second conductive pattern 118.

A storage node contact BC may be on an end portion of a respective one of the active regions AR. The storage node contact BC may be electrically connected to the source/drain region 50 in the end portion of each of the active regions AR. The storage node contact BC may have a lower portion that penetrates the buffer layer 112 and is disposed in each of the active regions AR. The storage node contact BC may have a top surface higher than that of the buffer layer 112. The storage node contact BC may include, for example, silicon germanium or boron-doped silicon germanium.

According to exemplary embodiments, silicon germanium is used as a compressively strained material in the bit line node contact DCC and the storage node contact BC. The silicon germanium may exert a compressive stress on the active regions AR below the bit line node contact DCC and the storage node contact BC, and thus may give an enhanced hole mobility to a channel between the bit line node contact DCC and the storage node contact BC. In addition, as the silicon germanium has low resistivity, the bit line node contact DCC and the storage node contact BC may have a decreased resistance. Therefore, the PMOS-type semiconductor memory device may be given improved current driving capability.

Spacers 124 may be on sidewalls of the bit line structures BLS and may extend onto sidewalls of the bit line node contact DCC. The spacers 124 may include, for example, one or more of a silicon oxide layer and a silicon nitride layer. A separation pattern 130 may be at an intersection where the word line WL intersects a space between the bit line structures BLS. For example, the separation pattern 130 may be on the buffer layer 112 and between the storage node contacts BC adjacent to each other in the second direction. The separation pattern 130 may include, for example, one of SiBCN, SiCN, SiOCN, or SiN.

A landing pad LP may be on the storage node contact BC and may be electrically connected to the storage node contact BC. In one embodiment, a plurality of landing pads LP may be physically (or spatially) spaced apart from each other. On the storage node contact BC, the landing pad LP may fill a space between separation patterns 130 facing each other in the second direction. The landing pad LP may be shifted in the first direction relative to a center of the storage node contact BC. As such, the landing pad LP may have a portion on a top surface of its underlying bit line structure BLS. The landing pad LP may include a barrier pattern 134 and a metal pattern 136 that are sequentially stacked on the storage node contact BC. The barrier pattern 134 may include, for example, TiN, Ti/TiN, TiSiN, TaN, or WN. The metal pattern 136 may include, for example, tungsten (W).

A gap-fill layer 138 may be in a space between a plurality of the landing pads LP and may surround outer sidewalls of the landing pads LP. The gap-fill layer 138 may have a top surface at the same level as those of the landing pads LP. The gap-fill layer 138 may include, for example, a TEOS (tetraethylorthosilicate) layer, a high density plasma (HDP) oxide layer, a silicon oxide layer, or a silicon nitride layer.

A data storage member may be on the landing pad LP and may be, for example, a capacitor. The capacitor may include a bottom electrode BE, a dielectric layer, and a top electrode. In one embodiment, a plurality of bottom electrodes BE may be provided in a predetermined (e.g., zigzag) pattern in the second direction Y.

Figure 3:
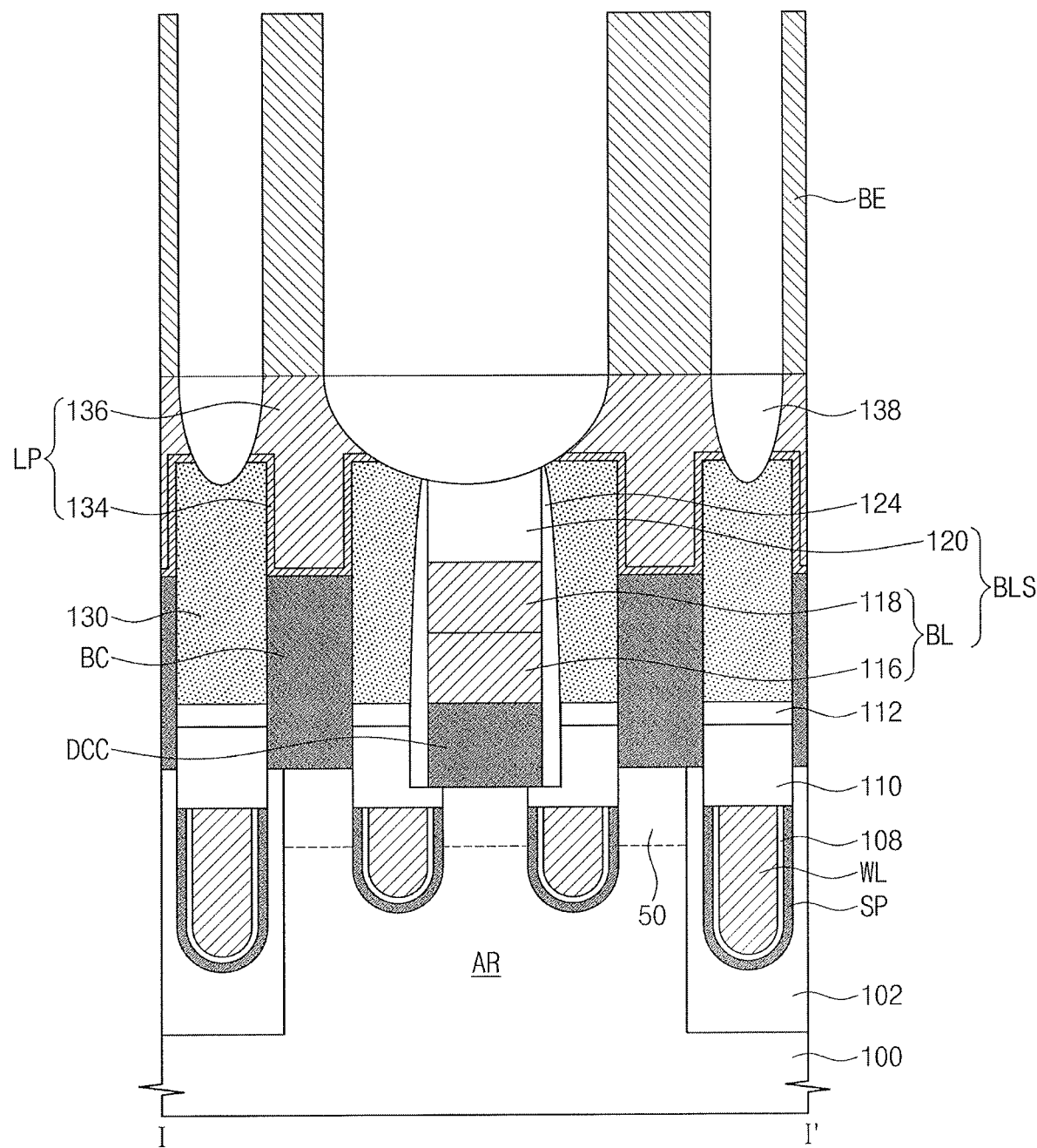
FIG. 3 illustrates another sectional embodiment along line I-I' in FIG. 1.

FIG. 3 illustrates another cross-sectional view taken along line I-I' of FIG. 1. Referring to FIG. 3, a semiconductor pattern SP may surround the sidewalls and a bottom surface of each of the word lines WL across the gate dielectric layer 108. The semiconductor pattern SP may be in direct contact with outer sidewalls and a bottom surface of the gate dielectric layer 108. The semiconductor pattern SP may include, for example, a silicon germanium layer, a silicon layer, or a Group III-V compound semiconductor layer. The bit line node contact DCC and the storage node contact BC may include, for example, impurity-doped polysilicon, boron-doped silicon germanium, or silicon germanium.

In an embodiment, when the substrate 100 is a silicon substrate, the semiconductor pattern SP may include a silicon germanium layer or a Group III-V compound semiconductor layer. When the semiconductor pattern SP includes a silicon germanium layer, the semiconductor pattern SP may experience a compressive stress due to a difference in lattice constant between silicon and germanium. Thus, a channel may be formed with enhanced hole mobility. When the semiconductor pattern SP includes a Group III-V compound semiconductor layer, as a Group III-V semiconductor material exhibits high electron mobility characteristics, it may be possible to improve current driving capability of the PMOS-type semiconductor memory device.

In an embodiment, when the substrate 100 is a Group III-V compound semiconductor substrate or a silicon germanium substrate, the semiconductor pattern SP may include a silicon layer. When the substrate 100 is a silicon germanium layer, the whole substrate may be used as a compressive stress layer to improve a hole mobility of a channel. As a result, the current driving capability of a PMOS-type semiconductor memory device may be improved.

When the substrate 100 is a Group III-V semiconductor substrate, because a Group III-V compound semiconductor material exhibits a high electron mobility as discussed above, it may be possible to improve current driving capability of a PMOS-type semiconductor memory device. When the semiconductor pattern SP is a silicon layer, a surface of the gate dielectric layer 108 may be surrounded by a silicon layer in order to improve interface characteristics between the gate dielectric layer 108 and the semiconductor pattern SP.

Figure 4:
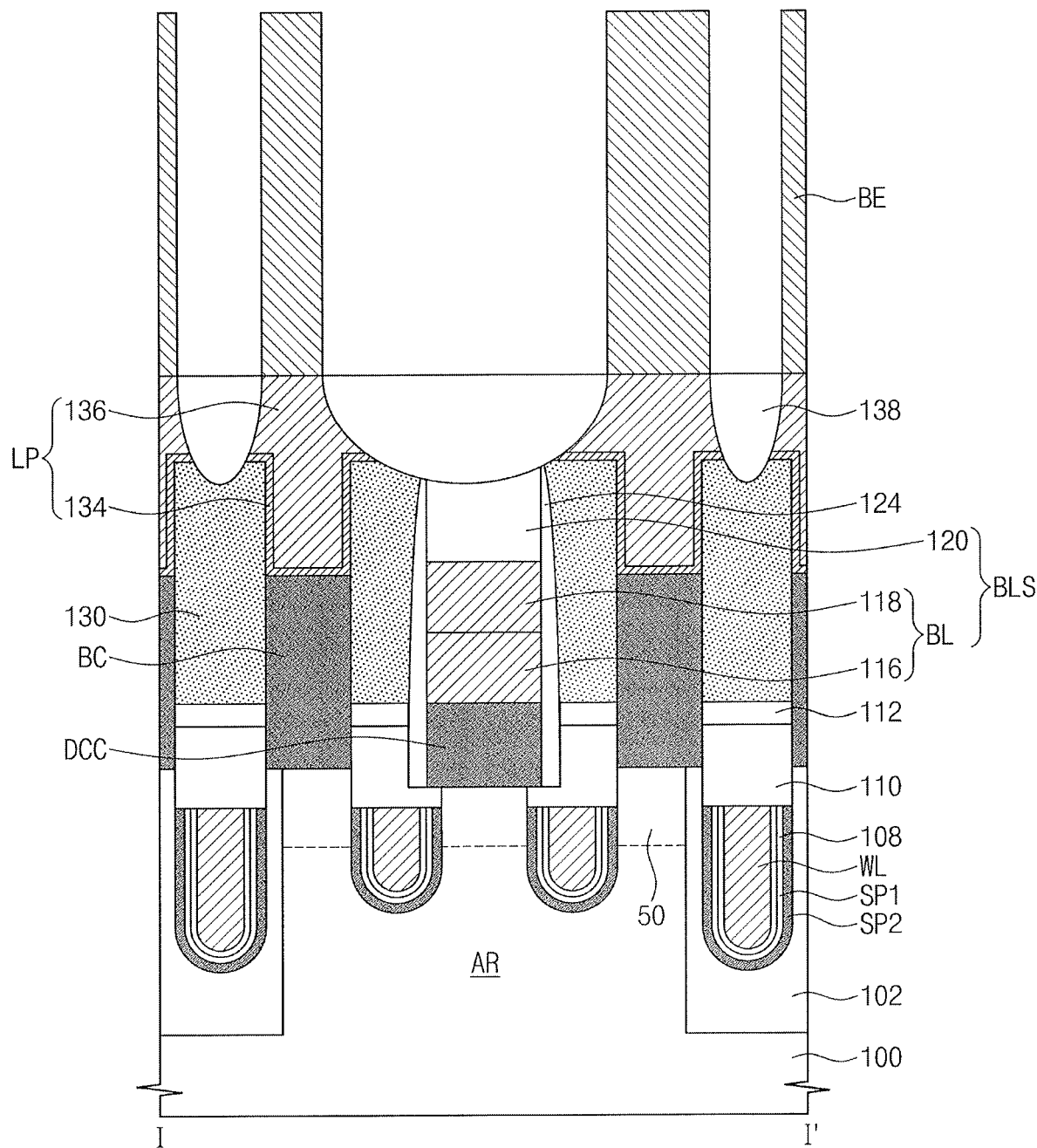
FIG. 4 illustrates another sectional embodiment along line I-I' in FIG. 1.

FIG. 4 illustrates another embodiment of a cross-sectional view taken along line I-I' in FIG. 1. Referring to FIG. 4, a first semiconductor pattern SP1 may surround the sidewalls and a bottom surface of each of the word lines WL across the gate dielectric layer 108. A second semiconductor pattern SP2 may surround outer sidewalls and a bottom surface of the first semiconductor pattern SP1. In other words, the first semiconductor pattern SP may be between the second semiconductor pattern SP2 and each of the word lines WL. The first semiconductor pattern SP1 may be in direct contact with the gate dielectric layer 108. The second semiconductor pattern SP2 may be in direct contact with the first semiconductor pattern SP1. The first semiconductor pattern SP1 may include a silicon layer. The second semiconductor pattern SP2 may include a Group III-V compound semiconductor layer or a silicon germanium layer. In this case, the substrate 100 may be, for example, a silicon substrate. The bit line node contact DCC and the storage node contact BC may include, for example, impurity-doped polysilicon, boron-doped silicon germanium, or silicon germanium.

FIGS. 5A to 10A illustrate various stages of an embodiment of a method for fabricating a semiconductor memory device. FIGS. 5B to 10B are cross-sectional views taken along line I-I' in FIGS. 5A to 10A.

Figure 5A:
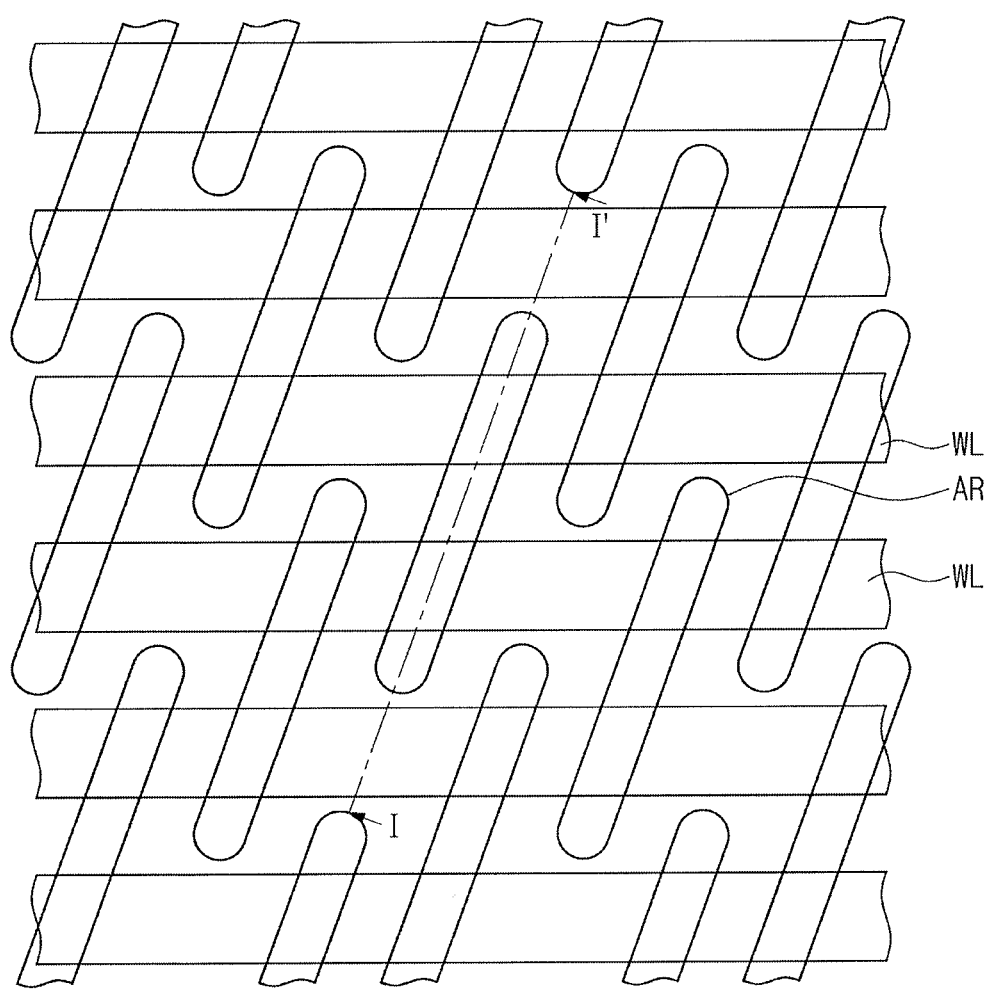
Figure 5B:
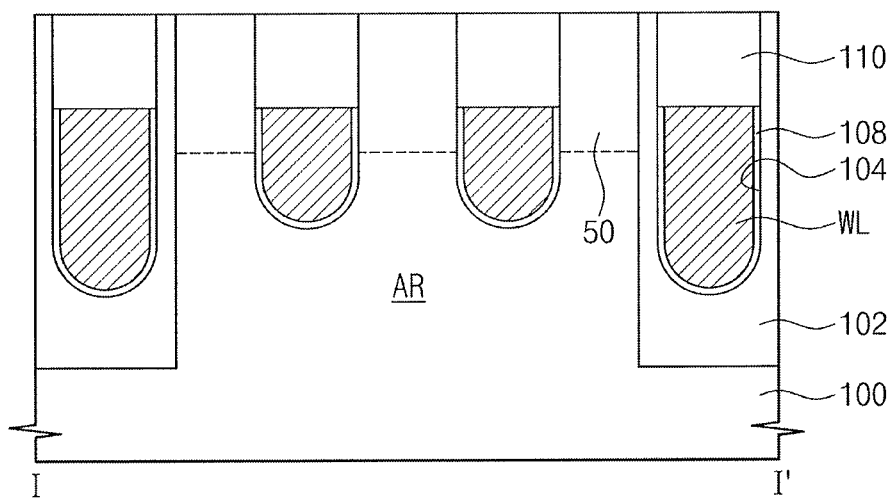

Referring to FIGS. 5A and 5B, a device isolation layer 102 may be formed in a substrate 100. The device isolation layer 102 may be formed, for example, by forming a trench in the substrate 100 and then filling the trench with an insulating material. The substrate 100 may be, for example, a bulk silicon substrate, a silicon on insulator (SOI) substrate, a germanium substrate, a germanium on insulator (GOI) substrate, a silicon-germanium substrate, a Group III-V compound semiconductor substrate, or an epitaxial thin-film substrate obtained by performing selective epitaxial growth (SEG). The device isolation layer 102 may include, for example, silicon oxide, silicon nitride, or silicon oxynitride.

The device isolation layer 102 may define active regions AR of the substrate 100. The active regions AR may have a predetermined (e.g., bar) shape elongated in a third (e.g., Z) direction and may be parallel to each other.

Source/drain regions 50 may be formed in the active regions AR. The source/drain regions 50 may be formed, for example, by forming an ion implantation mask on the substrate 100 and then performing an ion implantation process on the active regions AR exposed through the ion implantation mask. In one embodiment, the ion implantation process may be carried out without the ion implantation mask. The source/drain regions 50 may have P-type conductivity doped with a trivalent impurity element. For example, the source/drain regions 50 may include boron or indium.

Trenches 104 may be formed in the substrate 100. In one embodiment, two trenches 104 may run across a single active region AR in a first (e.g., X) direction crossing the third direction. A gate dielectric layer 108 may be formed to conformally cover a surface of each of the trenches 104. The gate dielectric layer 108 may include, for example, a silicon oxide layer, a thermal oxide layer, or a high-k dielectric layer.

Word lines WL may be formed in the trenches 104 including the gate dielectric layer 108 formed therein. The word lines WL may be formed by forming a metal layer to fill the trenches 104 and then performing an etch process on an upper portion of the metal layer so as to leave portions of the metal layer on lower portions of the trenches 104. When the metal layer is etched, the gate dielectric layer 108 may be partially etched together with the metal layer. The word lines WL may include a conductive material, for example, doped polysilicon, metal, or metal silicide.

Capping patterns 110 may be formed on the word lines WL. The capping patterns 110 may be formed to fill upper portions of the trenches 104. The capping patterns 110 may include, for example, silicon oxide, silicon nitride, or silicon oxynitride.

Figure 6A:
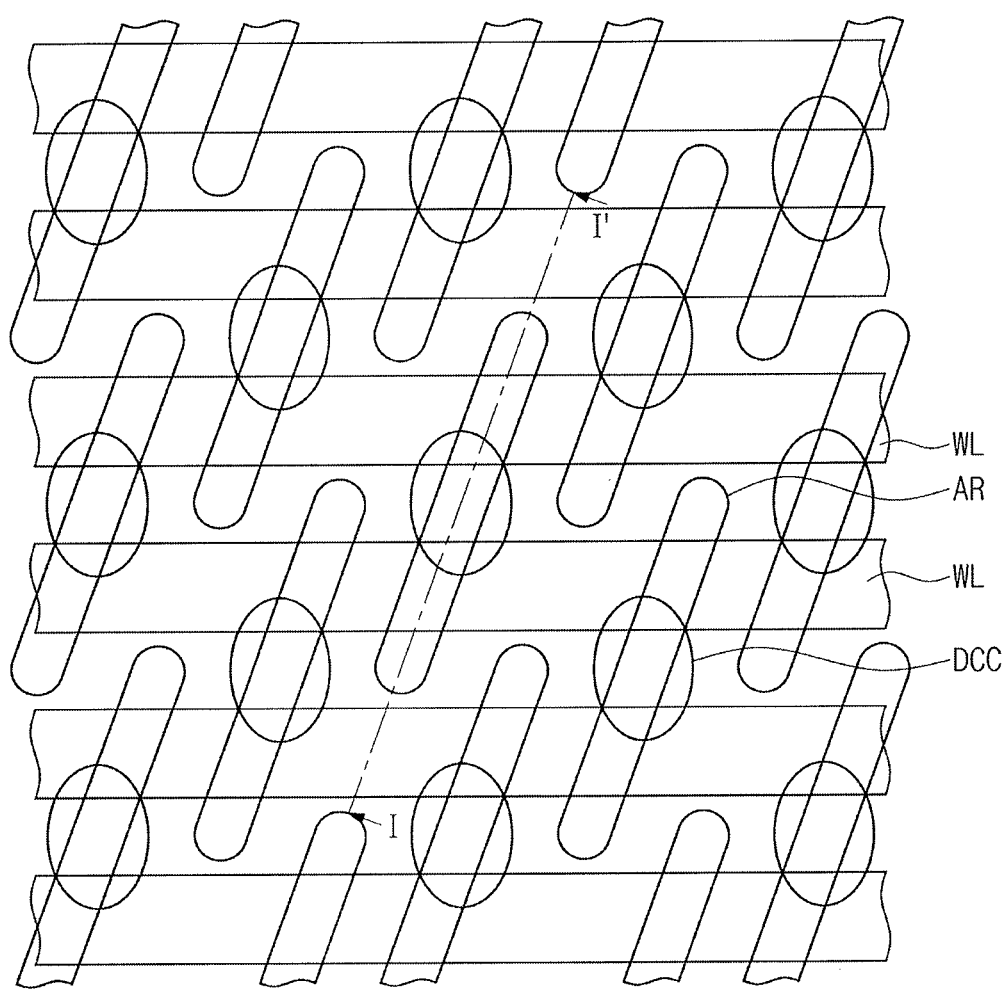
Figure 6A:
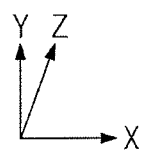
Figure 6B:
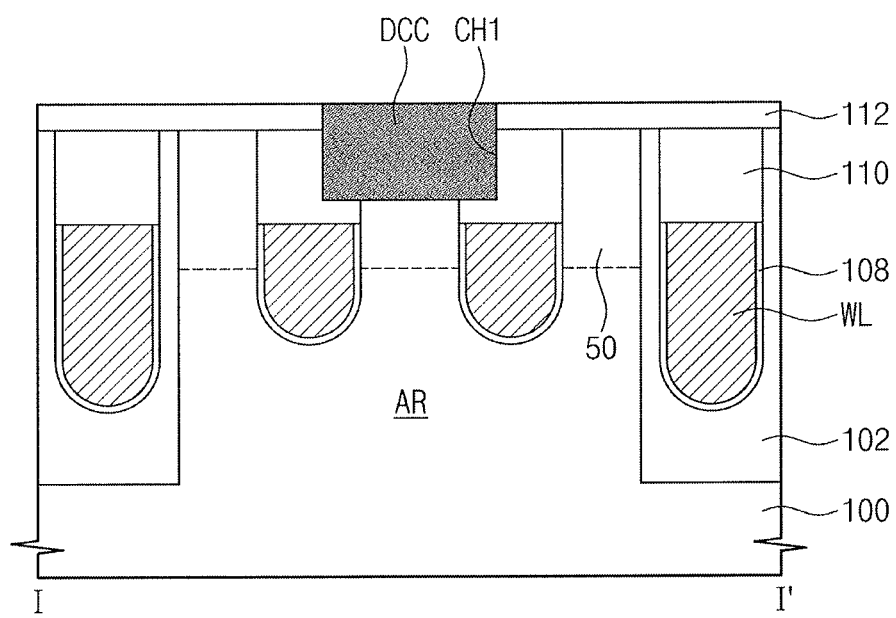

Referring to FIGS. 6A and 6B, a buffer layer 112 may be formed on the substrate 100. The buffer layer 112 may include one or more insulation layers. The buffer layer 112 may include, for example, a silicon oxide layer, a silicon nitride layer, a silicon oxynitride layer, or multiple insulation layers including at least two thereof.

A mask pattern including openings may be formed on the buffer layer 112. The mask pattern may be used as an etch mask to pattern the buffer layer 112 and the substrate 100. The patterning process may etch a portion of the buffer layer 112 and an upper portion of the substrate 100 to form a first contact hole CH1 in each of the active regions AR. In a plan view, the first contact hole CH1 may be formed in a central portion of one active region AR between two word lines WL. The first contact hole CH1 may expose one source/drain region 50 formed in the central portion of each of the active regions AR.

A bit line node contact DCC may be formed in the first contact hole CH1. The bit line node contact DCC may be formed by forming on the buffer layer 112 a semiconductor layer filling the first contact hole CH1 and then performing a planarization process (e.g., CMP or etch-back) on the semiconductor layer until exposing a top surface of the buffer layer 112. For example, the semiconductor layer may be doped with impurities simultaneously with or during forming the semiconductor layer to fill the first contact hole CH1. The bit line node contact DCC may include, for example, silicon germanium or boron-doped silicon germanium.

Figure 7A:
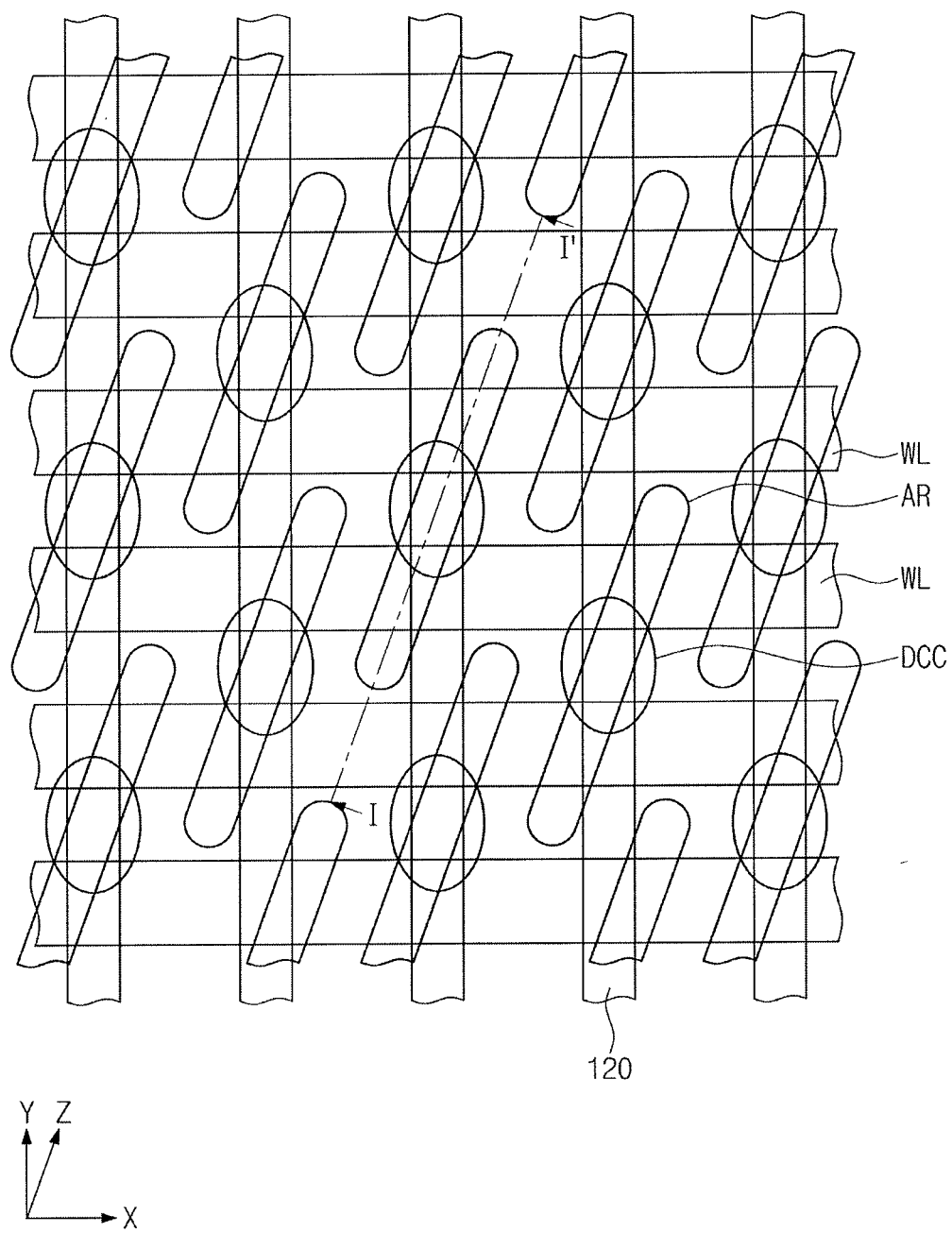
Figure 7B:
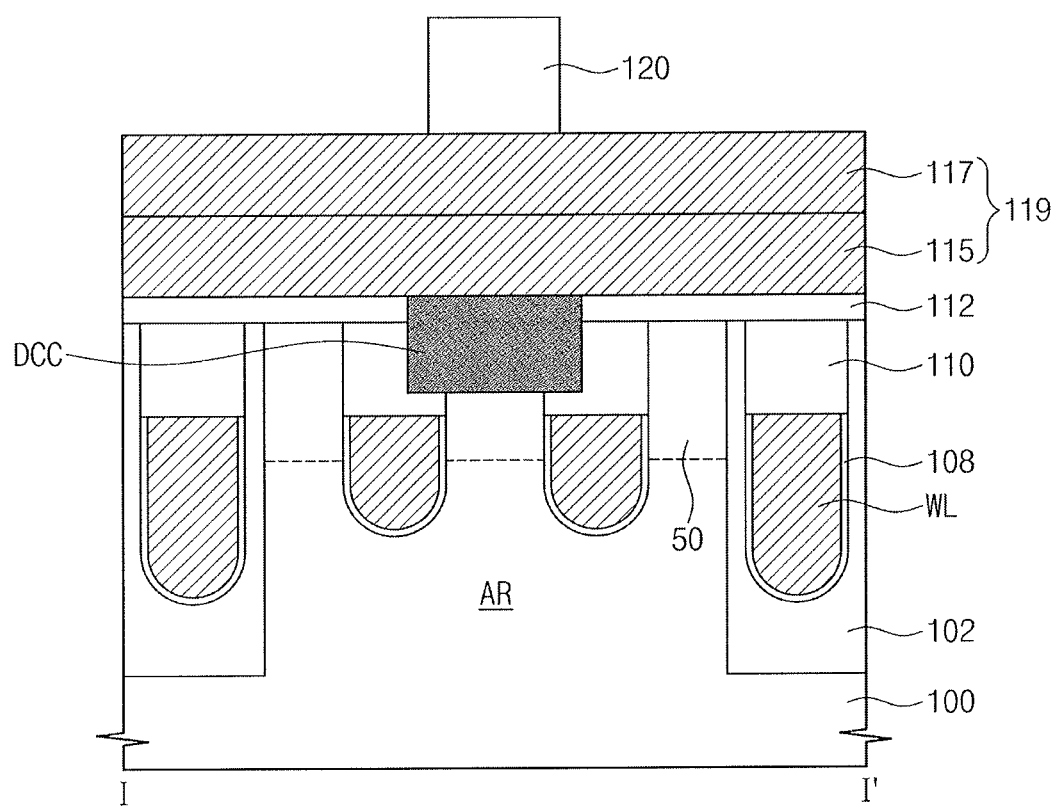

Referring to FIGS. 7A and 7B, an electrode layer 119 may be formed on the buffer layer 112. The electrode layer 119 may include a first electrode layer 115 and a second electrode layer 117 sequentially stacked on the buffer layer 112. The first electrode layer 115 may include, for example, doped polysilicon. The second electrode layer 117 may include, for example, tungsten (W), aluminum (Al), copper (Co), nickel (Ni), or cobalt (Co). A diffusion barrier layer may be between the first and second electrode layers 115 and 117. The diffusion barrier layer may include a diffusion barrier metal, for example, TiN, Ti/TiN, TiSiN, TaN, or WN.

Insulation patterns 120 may be formed on the second electrode layer 117. For example, the insulation patterns 120 may include a silicon oxide layer or a silicon oxynitride layer.

Figure 8A:
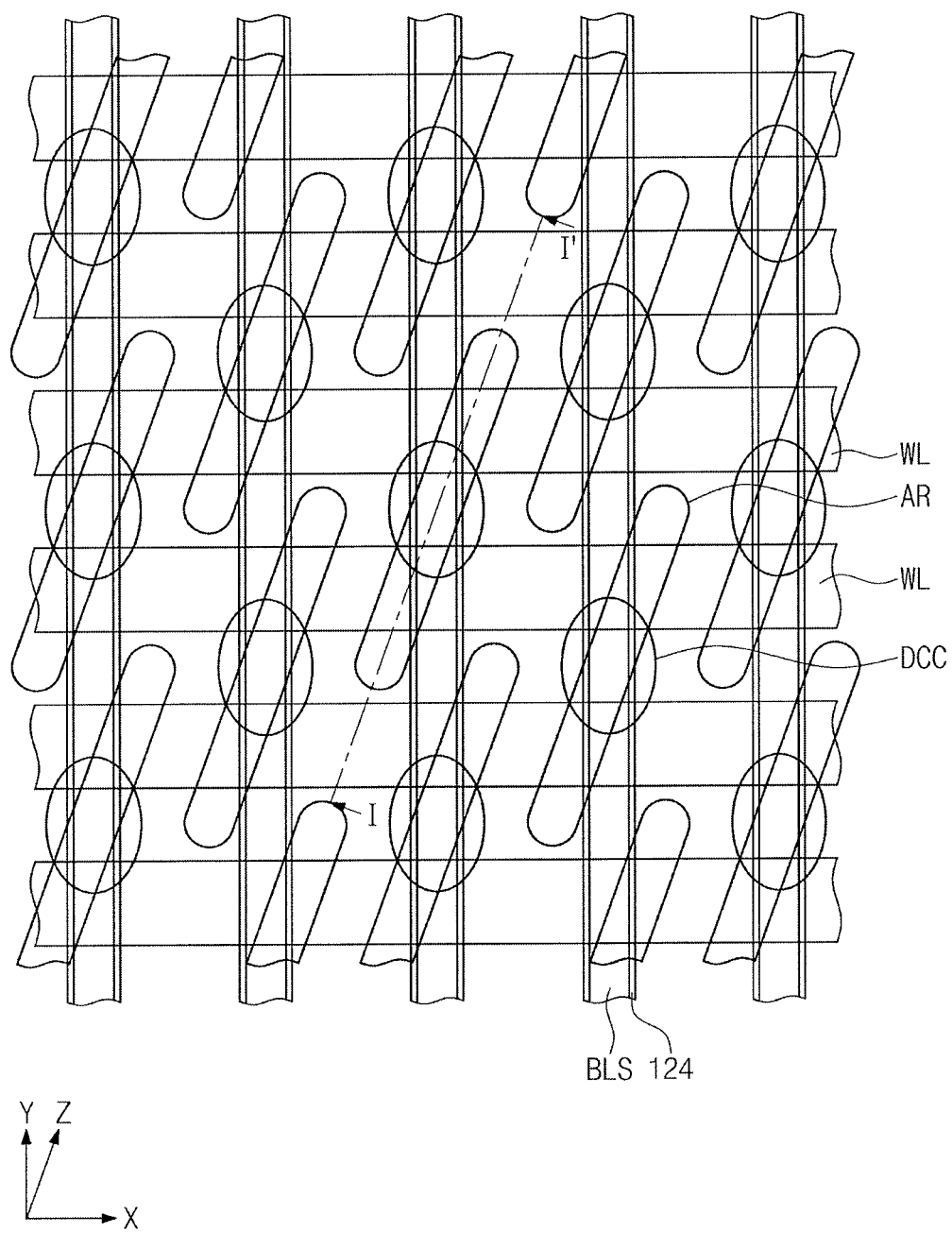
Figure 8B:
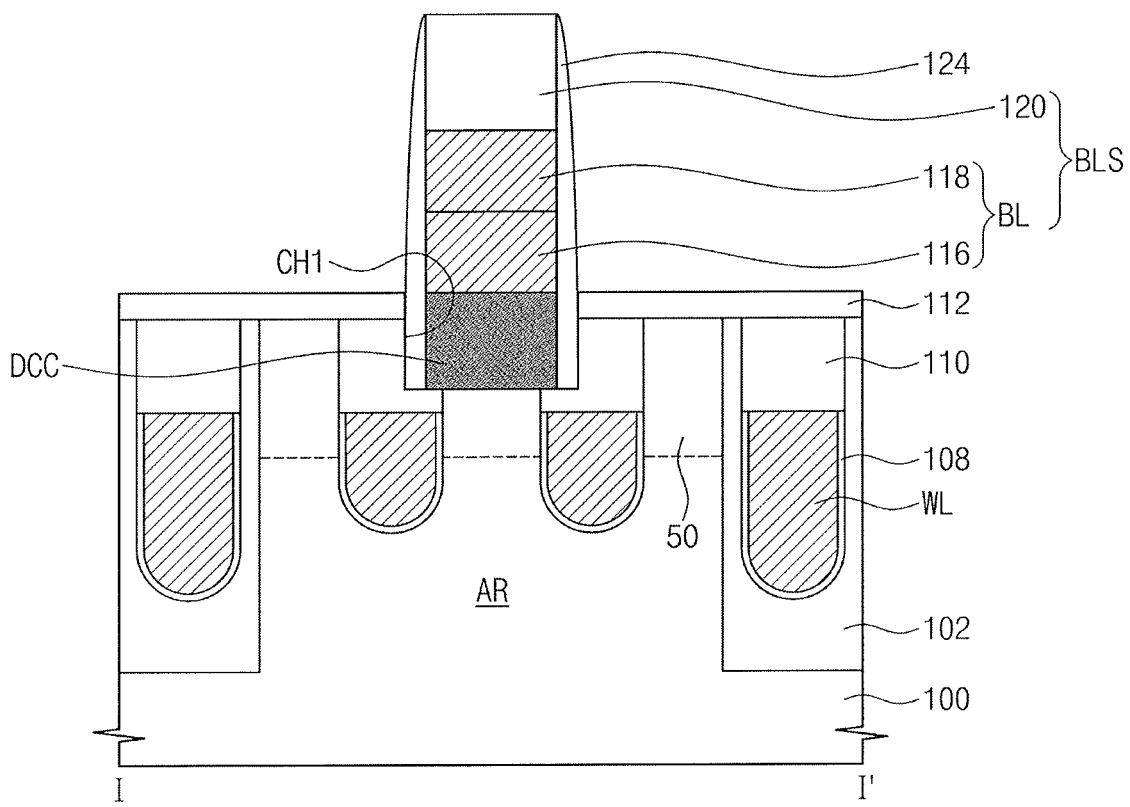

Referring to FIGS. 8A and 8B, bit lines BL may be formed to run across the active regions AR in a second (e.g., Y)

direction crossing the first and third directions. A single bit line BL may run over a plurality of the bit line node contacts DCC arranged in the second direction. The bit lines BL may be formed by using the insulation patterns 120 as an etch mask to sequentially pattern the second electrode layer 117 and the first electrode layer 115. Each of the bit lines BL may include a first conductive pattern 116 and a second conductive pattern 118 sequentially formed on a plurality of the bit line node contacts DCC arranged in the second direction.

After the bit lines BL are formed, an etch process may be performed to partially etch the bit line node contacts DCC exposed through the bit lines BL. Each of the bit line node contacts DCC may thus have a reduced width, which may be substantially the same as a width of each of the bit lines BL. The bit line node contact DCC may be spaced apart from sidewalls of the first contact hole CH1. In an embodiment, a single bit line structure BLS may be formed of one bit line BL and one insulation pattern 120.

Spacers 124 may be formed to cover sidewalls of the bit line structure BLS and sidewalls of the bit line node contact DCC. The spacers 124 may be formed by forming an insulation layer to conformally cover a top surface of the buffer layer 112, sidewalls of the bit line node contact DCC, sidewalls of the bit lines BL, and sidewalls and top surfaces of the insulation patterns 120. An etch-back process on the insulation layer may then be performed to expose the top surfaces of the insulation patterns 120 and the top surface of the buffer layer 112. The spacers 124 may include, for example, two or more of a silicon oxide layer, a silicon nitride layer, and a silicon oxynitride layer.

Figure 9A:
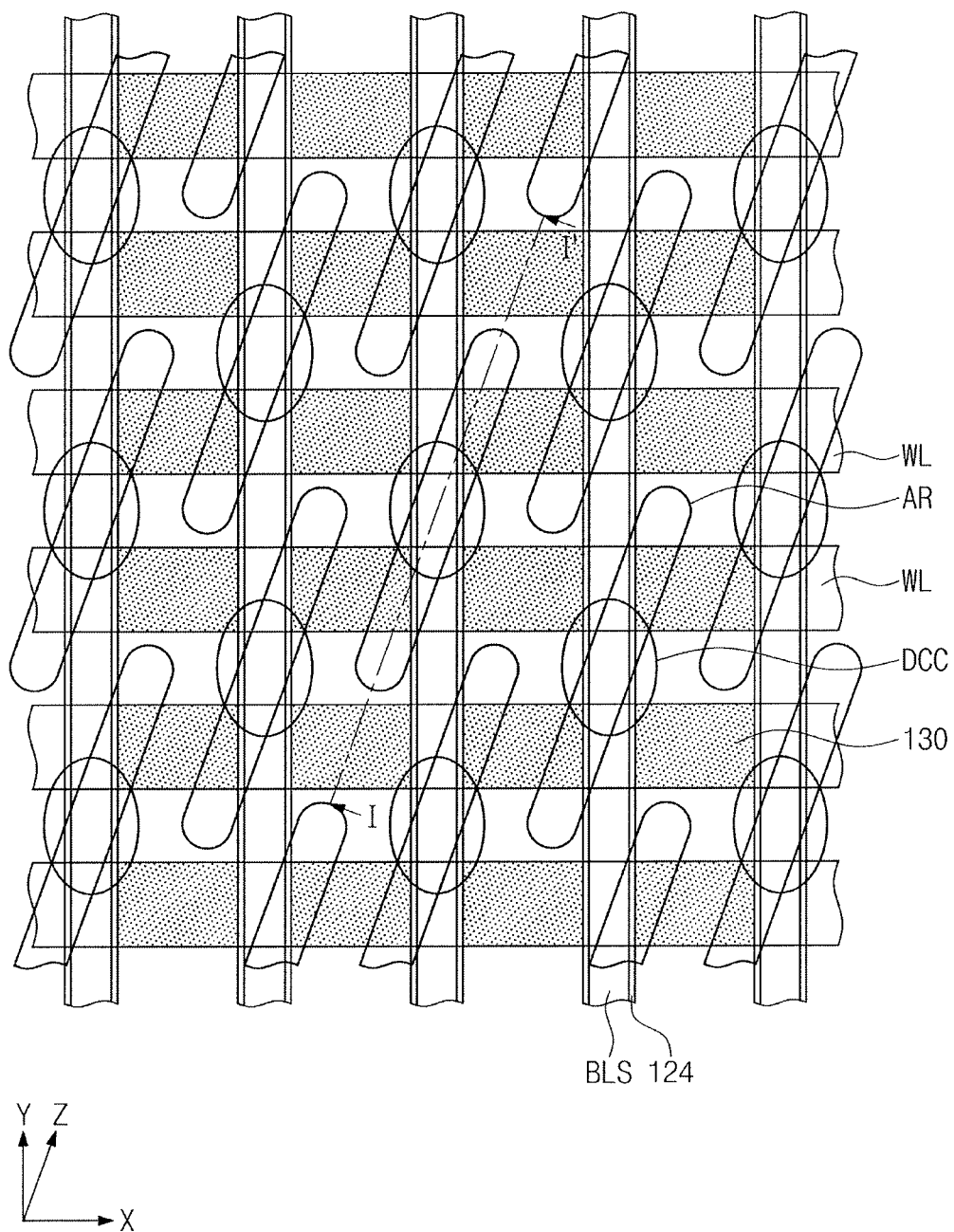
Figure 9B:
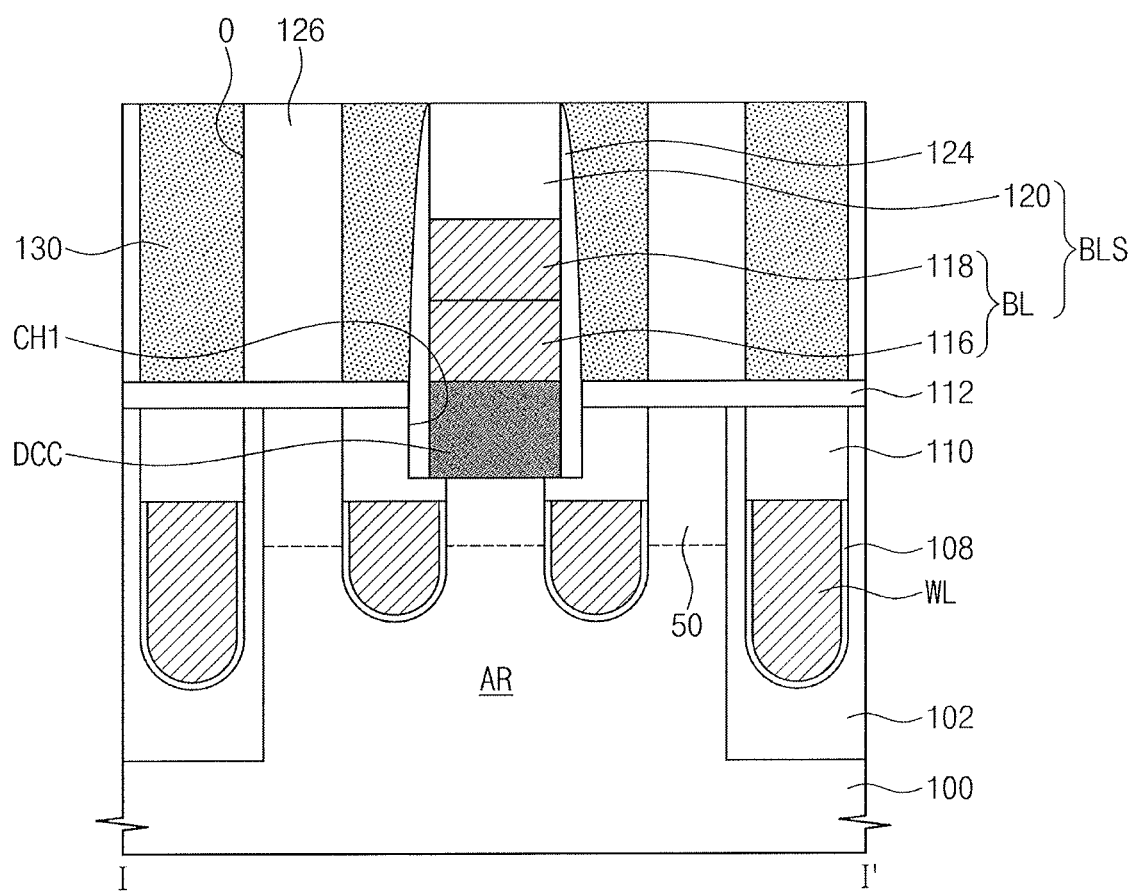

Referring to FIGS. 9A and 9B, an interlayer dielectric layer 126 may be formed on the buffer layer 112. The interlayer dielectric layer 126 may be formed by forming an insulation layer to fill a space between the bit line structures BLS and also to cover the top surfaces of the insulation patterns 120. A planarization process on the insulation layer may then be performed to expose the top surfaces of the insulation patterns 120. The interlayer dielectric layer 126 may include, for example, a silicon oxide layer.

The interlayer dielectric layer 126 may be etched to remove portions vertically overlapping the word lines WL. As a result, openings O may be formed in the interlayer dielectric layer 126. The openings O may be filled with an insulating material to form separation patterns 130. The separation patterns 130 may be formed of a material having an etch selectivity to the interlayer dielectric layer 126. For example, the separation patterns 130 may include one or more of a SiBCN layer, a SiCN layer, a SiOCN layer, or a SiN layer.

Figure 10A:
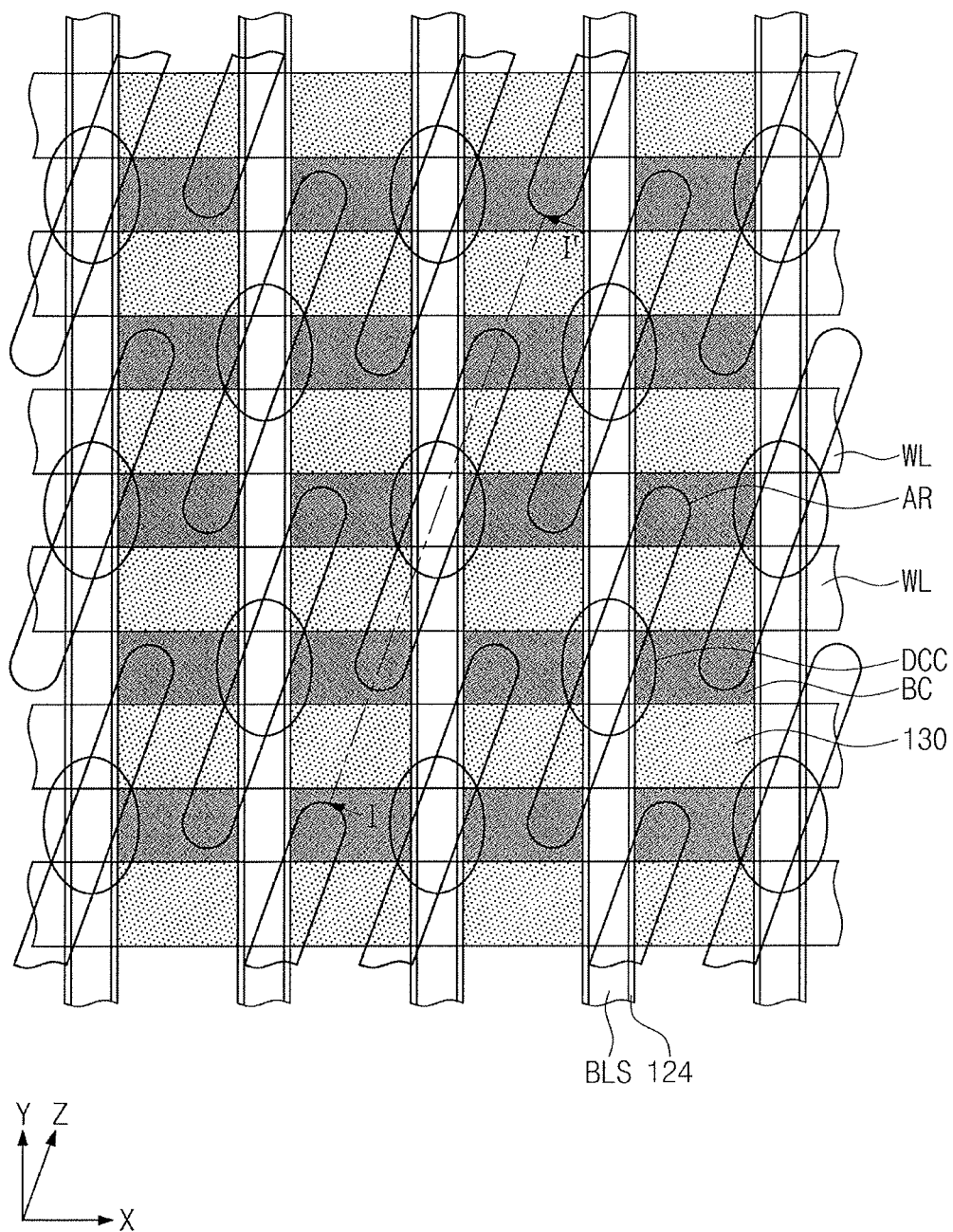
Figure 10B:
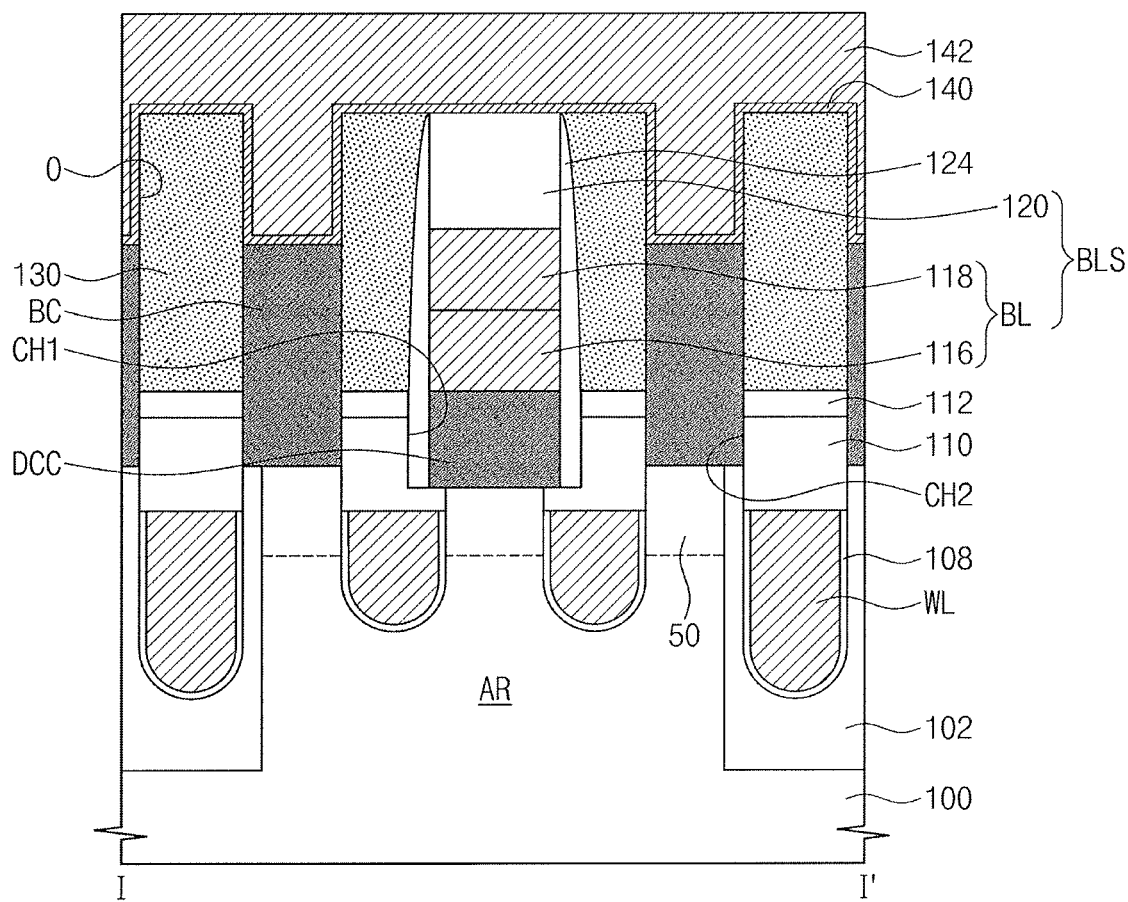

Referring to FIGS. 10A and 10B, storage node contacts BC may be formed in end portions of the active regions AR. The storage node contacts BC may be formed by etching the interlayer dielectric layer 126, a portion of the buffer layer 112, and an upper portion of the substrate 100 to form second contact holes CH2, forming a semiconductor layer to fill the second contact holes CH2 and also to cover top surfaces of the separation patterns 130, and then etching an upper portion of the semiconductor layer. Through these processes, the storage node contacts BC may be locally formed in the second contact holes CH2. The storage node contacts BC may have top surfaces lower than those of the separation patterns 130.

The semiconductor layer may be doped with impurities simultaneously with or during forming the semiconductor layer to form the storage node contacts BC. The storage node contacts BC may have voids formed due to a high aspect ratio of the second contact holes CH2. In this case, an annealing process may be performed to melt the storage node contacts BC to remove the voids. A laser may be used to perform the annealing process. The storage node contacts BC may include, for example, silicon germanium or boron-doped silicon germanium.

A barrier layer 140 and a metal layer 142 may be sequentially formed in the second contact holes CH2 in which the storage node contacts BC are formed. The barrier layer 140 may conformally cover top surfaces of the storage node contacts BC, sidewalls of the separation patterns 130 exposed through the storage node contacts BC, and top surfaces of the separation patterns 130. The barrier layer 140 may include, for example, a metal nitride layer such as TiN, TaN, or WN. The metal layer 142 may cover a top surface of the barrier layer 140 and completely fill the second contact holes CH2. The metal layer 142 may include, for example, tungsten (W).

Referring back to FIGS. 1 and 2, landing pads LP may be formed on the storage node contacts BC. The metal layer 142 and the barrier layer 140 may be patterned to form the landing pads PL that are electrically and physically separated from each other. The landing pads LP may be electrically connected to the storage node contacts BC. Each of the landing pads LP may include a barrier pattern 134 and a metal pattern 136.

A gap-fill layer 138 may be formed to fill a space between the landing pads LP. The gap-fill layer 138 may have a top surface at substantially the same level as those of the landing pads LP. The gap-fill layer 138 may include, for example, a TEOS (tetraethylorthosilicate) layer, a high density plasma (HDP) oxide layer, a silicon oxide layer, or a silicon nitride layer.

A data storage member may be formed on each of the landing pads LP. The data storage member may be, for example, a capacitor. The formation of the data storage member may include forming on the landing pad LP a bottom electrode BE, a dielectric layer, and a top electrode.

In accordance with one or more of the aforementioned embodiments, silicon germanium may be in a bit line node contact electrically connected to a bit line and/or a storage node contact electrically connected to a data storage member. A compressive stress may be exerted on active regions below the bit line node contact and the storage node contact including silicon germanium, which may give an enhanced hole mobility to a channel formed between the bit line node contact and the storage node contact. Therefore, a PMOS-type semiconductor memory device may be made to have improved current driving capability.

In accordance with one or more of the aforementioned embodiments, a semiconductor pattern may surround sidewalls and a bottom surface of each of word lines disposed in a substrate, and may have a semiconductor material different from that of the substrate. When a silicon germanium layer is in the semiconductor pattern and/or the substrate, enhanced hole mobility may be achieved. When a Group III-V semiconductor material is included in the semiconductor pattern and/or the substrate, enhanced electron mobility may be achieved. Therefore, a PMOS-type semiconductor memory device may be provided with improved current driving capability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor memory device, comprising:
a substrate including an active region;
word lines extending across the active region in a first direction;
a bit line on the active region between the word lines, the bit line extending in a second direction crossing the first direction;
a bit line node contact between the bit line and the active region;
a storage node contact extending from an end portion of the active region beyond a top surface of the substrate, the storage node contact including a lower portion below the top surface of the substrate and an upper portion above the top surface of the substrate, wherein the lower and upper portions of the storage node contact include silicon germanium; a first semiconductor pattern surrounding sidewalls and a bottom surface of each of the word lines, wherein the first semiconductor pattern includes a silicon germanium layer or a Group III-V compound semiconductor layer; and a second semiconductor pattern between the first semiconductor pattern and each of the word lines, wherein the second semiconductor pattern includes a semiconductor material different from that of the first semiconductor pattern.

2. The semiconductor memory device as claimed in claim 1, further comprising:
source/drain regions in a portion of the active region below the bit line node contact and in a portion of the active region below the storage node contact, wherein the source/drain regions include a trivalent impurity element.

3. The semiconductor memory device as claimed in claim 2, wherein the trivalent impurity element includes boron (B) or indium (In).

4. The semiconductor memory device as claimed in claim 1, wherein the first semiconductor pattern includes a silicon layer and wherein the substrate is one of a silicon germanium substrate or a Group III-V compound semiconductor substrate.

5. The semiconductor memory device as claimed in claim 1, wherein one or more of the bit line node contact or the storage node contact are doped with boron.

6. The semiconductor memory device as claimed in claim 1, wherein the bit line node contact extends from the active region beyond the top surface of the substrate, and includes a lower portion below the top surface of the substrate and an upper portion above the top surface of the substrate, and wherein the lower and upper portions of the bit line node contact include silicon germanium.

* * * * *